United States Patent [19]
Nelson et al.

[11] Patent Number: 4,502,020
[45] Date of Patent: Feb. 26, 1985

[54] SETTLING TIME REDUCTION IN WIDE-BAND DIRECT-COUPLED TRANSISTOR AMPLIFIERS

[75] Inventors: David A. Nelson; Kenneth R. Saller, both of Loveland, Colo.

[73] Assignee: Comlinear Corporation, Loveland, Colo.

[21] Appl. No.: 545,753

[22] Filed: Oct. 26, 1983

[51] Int. Cl.³ .............................................. H03F 3/26
[52] U.S. Cl. .................................. 330/265; 330/108; 330/262; 330/267
[58] Field of Search ................. 330/81, 262, 265, 267, 330/271, 273, 281, 311, 108, 255, 258

[56] References Cited
U.S. PATENT DOCUMENTS
4,135,162  1/1979  Takahashi ........................... 330/255

Primary Examiner—James B. Mullins
Assistant Examiner—Steven J. Mottola

[57] ABSTRACT

A wide-band direct-coupled transistor amplifier exhibits greatly improved settling time characteristics as the result of circuitry permitting the use of current feedback rather than voltage feedback in order to reduce the sensitivity of settling time and bandwidth to feedback elements without thereby affecting the manner in which feedback is applied externally by the user, reducing the sensitivity of settling time to the effects of temperature, eliminating saturation and turn-off problems within the amplifier that are related to bias control, to large input signals, and to high frequency input signals or those having fast rise times, and minimizing the sensitivity of settling time to power supply voltages.

36 Claims, 14 Drawing Figures

REFERENCE BIAS
CURRENT (MAY BE
SET BY RESISTOR
OR BY CURRENT
SOURCE)

SETTLING TIME REDUCTION IN WIDE-BAND DIRECT-COUPLED TRANSISTOR AMPLIFIERS

REFERENCE TO RELATED PATENT

This application is related to the subject matter of U.S. Patent Ser. No. 4,358,739, entitled WIDE-BAND DIRECT-COUPLED TRANSISTOR AMPLIFIER, and issued Nov. 9, 1982, to David A. Nelson. The subject matter thereof is incorporated herein by reference.

BACKGROUND AND SUMMARY OF THE INVENTION

This invention relates generally to wide-band direct-coupled transistor amplifiers of the type described in U.S. Patent Ser. No. 4,358,739 to Nelson, and more specifically to improved implementations of such amplifiers to achieve reduced settling time characteristics. One embodiment of the wide-band direct-coupled transistor amplifier described in the Nelson patent is illustrated in FIG. 1 of the present application. In that embodiment, an input voltage $V_1$ produces an in phase amplified voltage $V_3$, and another input voltage $V_2$ produces a voltage $V_3$ that is 180 degrees out of phase therewith, such that $V_3 = A(V_1 - xV_2)$, where A and x are factors that are functions of the circuit component values, the temperature of the components, the source and load impedances, the supply voltages $\pm V_{cc}$, and the magnitude and frequency of the input voltages. All of these factors have an adverse influence upon the settling time of the amplifier, which may be precisely defined for a linear system such as this, as being the time required, following the initiation of a step voltage for $V_1$ or $V_2$ or both, for the output to enter and remain within a specified narrow band centered on its steady state value.

Many techniques known in the art for reducing settling time in other types of amplifiers are obvious and are applicable to the amplifier of FIG. 1. For example, precision matched resistors having low temperature coefficients of resistance are useful. In addition, the use of monolithic transistors for Q0x and Q1x creates good thermal coupling so that the long term temperature of both transistors will be very close. This prevents the occurrence of large thermally induced $V_{be}$ mismatches. Likewise, in accordance with the instant FIG. 2, a diode connected transistor Q3x, thermally coupled to Q2x, may be coupled in series with RC1x to prevent a long term change in the collector current of Q2x as a function of temperature. A straightforward approach to reducing the effect of load impedance on amplifier settling time is to add a unity gain buffer B1 in series with the output, a difference which is also illustrated in FIG. 2. Lastly, to reduce the effect of $V_{cc}$ on settling time, transistors having a greater Early Voltage rating can be used and the value of RF2 can be increased. While these known techniques for reducing settling time are somewhat effective, their incorporation into amplifiers of the type taught by the Nelson reference does not result in a sufficiently reduced settling time characteristic for many applications.

It is, therefore, the principal object of the present invention to provide a wide-band direct-coupled transistor amplifier having a greatly improved settling time characteristic. This object is accomplished in accordance with the illustrated embodiments of this invention by modifying an amplifier of the type taught by Nelson to allow the use of current feedback rather than voltage feedback in order to reduce the sensitivity of settling time and bandwidth to feedback elements without thereby affecting the manner in which feedback is applied externally by the user, to reduce the sensitivity of settling time to the effects of temperature, to eliminate saturation and turn-off problems within the amplifier that are related to bias control, to large input signals, and to high frequency input signals or those having fast rise times, and to minimize the sensitivity of settling time to supply voltages.

DETAILED DESCRIPTION OF THE ILLUSTRATED EMBODIMENTS

Figure 1:
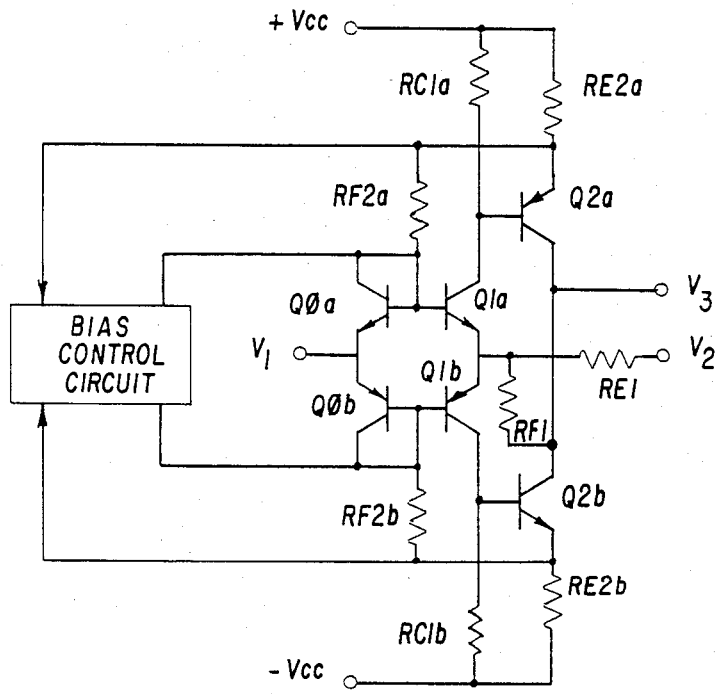
FIG. 1 is a detailed schematic diagram of a wide-band direct-coupled transistor amplifier constructed in accordance with the teachings of the prior art.
Figure 2:
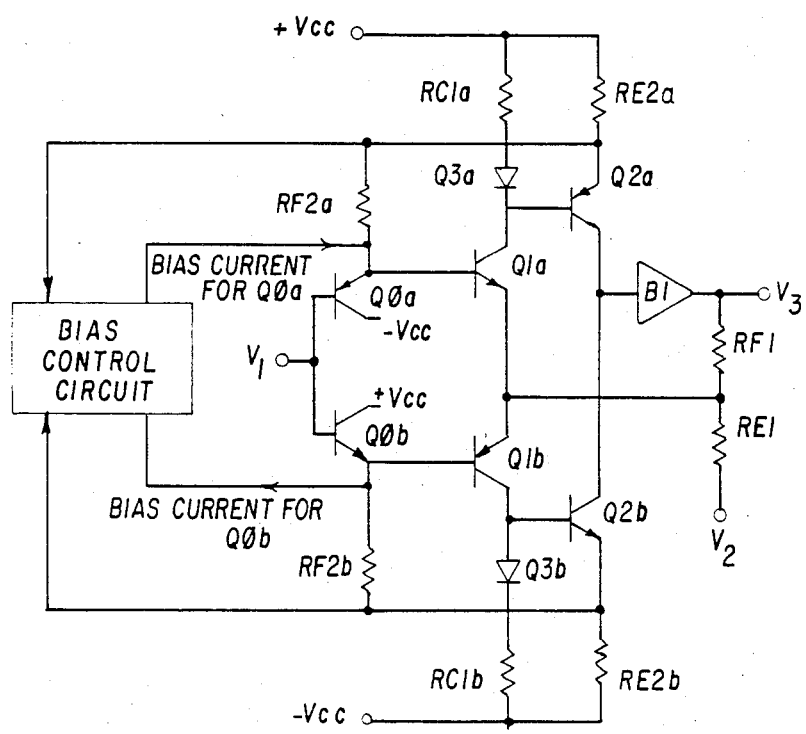
FIG. 2 is a detailed schematic diagram of an embodiment of the amplifier of FIG. 1 that is employed in implementing the teachings of the present invention to greatly improve the amplifier settling time characteristic.
Figure 3:
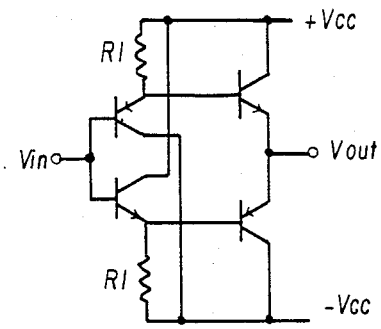
FIG. 3 is a detailed schematic diagram of a unity gain buffer that is known in the prior art.
Figure 4:
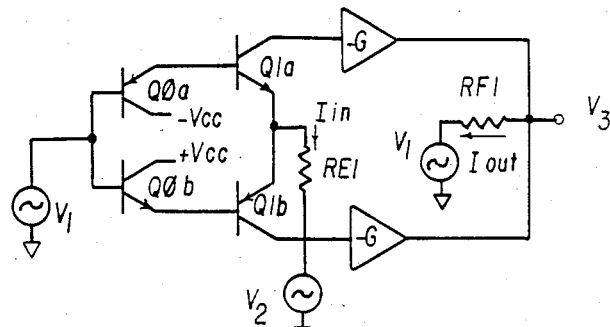
FIG. 4 is a simplified schematic diagram of illustrating a portion of the amplifier of FIG. 2 for purposes of analyzing its operation.

Referring now to the detailed schematic diagram of FIG. 1, there is shown an amplifier whose input stage consists of the transistor pairs Q0 and Q1. Connected as shown in FIG. 3, this input stage forms a wideband, unity gain buffer, referred to in detail in Knitter and Zuch, *Unity-gain Buffer Amplifier is Ultrafast*, Electronics, Apr. 27, 1978, pp. 124–125. When this circuit is modified as illustrated in FIG. 2 such that the collectors of the Q1 transistor pair are connected to the next gain stage and the emitter current for the Q0 transistor pair is supplied by the bias control circuit taught by Nelson rather than by a resistor, a significant improvement in amplifier performance results, based upon the fact that the amplifier now operates in a current feedback mode rather than a voltage feedback mode. This result may be understood with reference to FIG. 4. The gain of the Q2 pair and B1 stage is described as inverting gain "G" for simplicity. For purposes of analysis, the feedback path through RF1 from $V_3$ to the emitters of the Q1 transistor pair is broken and the loose end of RF1 is terminated in a voltage $V_1$, since the voltage at the emitter of the Q1 pair is also $V_1$. With $V_2=0$, the open loop gain is described by the transfer function $I_{out}/I_{in}$, where $-I_{out}=(V_3-V_1)/RF1=(V_1/RE1)(G+RE1)/RF1$, and $I_{in}=(V_1/RE1)$. Hence, $(I_{out}/I_{in})$ is equal to $-(G+RE1)/RF1$. In the case of $G>>RE1$, RE1 has almost no influence on the open loop gain. In practice, it is easy to make $G>>RE1$, even at high frequencies. Thus, when the loop is closed, the closed loop gain becomes $(V_3/V_1)=(1+RF1/RE1)/(1+RF1/G)$, and since G is the only frequency dependent term, RE1 cannot influence the $-3$ dB bandwidth, settling time, or other parameters. When $V_2$ is unequal to 0 and $V_1=0$, the open loop gain is $I_{out}/I_{in}=-(G/RF1)$, with no dependence on RE1, and the closed loop gain becomes $(V_3/V_2)=(-RF1/RE1)/(1+RF1/G)$. These equations for closed loop gain are identical to those for a common differential input operational amplifier, so this new embodiment is transparent to the user. The advantage it offers is that the amplifier can be designed and manufactured to give optimum open-loop pole-zero response for a fixed value of RF1. The user may still control gain by selecting the value of RE1. As a result, no external compensation is necessary for optimum bandwidth and settling time, whatever the gain. This means that the amplifier has the same bandwidth and settling time at a gain of 1 or 2 as it does at a gain of 30 or 40, limited only by the requirements that $G>>RE1$ and that $RE1>2r_e$ of the Q1 transistors. This is unlike prior art amplifiers, which are burdened with the restriction that gain and bandwidth are inversely proportional, requiring the user to provide external compensation that varies according to gain in order to optimize performance. Settling time and distortion are also greatly affected by the closed loop gain.

Figure 5:
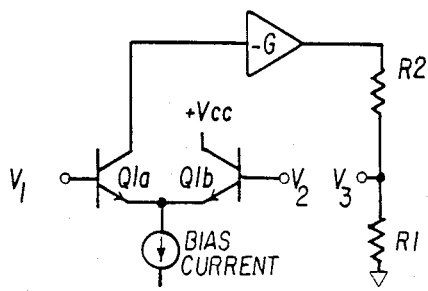
FIG. 5 is a simplified schematic diagram of a conventional amplifier topology illustrating the known use of voltage feedback.

FIG. 5 provides an illustration of why a conventional differential input (emitter coupled pair) based amplifier suffers from this problem. For purposes of analysis, the feedback path is broken to compute the open-loop gain. Note that the feedback signal is now in the form of a voltage, rather than a current. With $V_2=0$, $V_3=(V_1/2r_{eQ1})(G)(R_1/(R_1+R_2))$. Therefore, $(V_3/V_1)$, which is the open-loop gain, is equal to the expression $(GR_1)/(2r_{eQ1})(R_1+R_2)$. In this equation, $R_1$ multiplies G rather than being added to it, so both $R_1$ and $R_2$ will dominate the open-loop response, and the closed-loop response leads to the difficulties referred to above.

Figure 7:
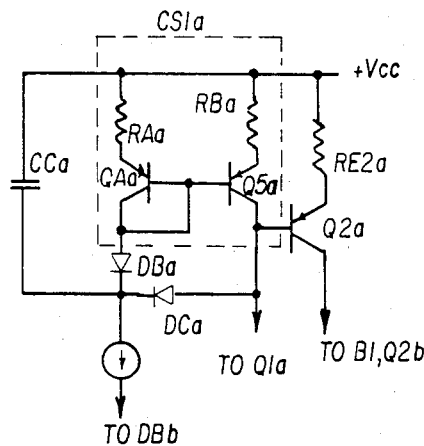
FIG. 7 is a detailed schematic diagram illustrating one embodiment of a current source that may be employed in the amplifier of FIG. 2, together with some additional components, for preventing saturation of a transistor pair.
Figure 8:
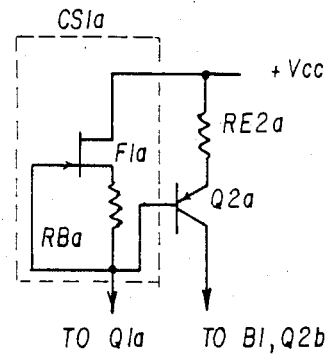
FIG. 8 is a detailed schematic diagram of illustrating an alternative embodiment of a current source that may be employed in the amplifier of FIG. 2 for preventing saturation of a transistor pair.

While the use of monolithic, thermally coupled transistors for the Q2 and Q3 transistors pairs will substantially reduce the long term $V_{be}$ mismatch which causes an output error in the amplifier of FIG. 2, short term settling performance in the 0 to 300 ns range is not thereby improved, given the present practical size of commercially available transistor cells. Recently introduced products such as the HA2539 from the Harris Semiconductor Corporation use this technique for settling times of 300 ns to 0.1% error. Such products are used with a conventional differential emitter-coupled input stage, so some gain precedes the point at which this thermally induced error occurs, and so under closed-loop conditions the magnitude of the error is reduced in proportion to the gain preceding it. In the amplifier of FIG. 2. the gain preceding the Q2 transistor pair is proportional to RC1x. (A reference herein to RC1x is the same as a reference to either RC1a or RC1b. Similar references to other components carry the same implication, since much of the amplifier circuitry discussed is symmetric. Likewise, a modification described as having been made to one side of a symmetric circuit is impliedly made to the other side of that symmetric circuit.) By replacing RC1x and Q3x with a fixed value current source CS1x (as illustrated in FIGS. 7 and 8), the necessary current can still be supplied to Q1x and Q2x, while insuring that the effective impedance is $>>RC1x$. This results in higher gain preceding Q2x and reduces the sensitivity of settling time to thermal changes in Q2x. Hence, when $V_{beQ2}$, which varies at $-2$ mV/degree C., changes due to self-heating or an external heat source, the overall effect under closed-loop conditions will be very small. Care must be taken to insure that this current source does not adversely interact with the bias control circuit 10. Close matching of the "a" and "b" current sources is required, as any mismatch between the two will be manifest as an input offset current at the emitters of the Q1 transistor pair.

Figure 6:
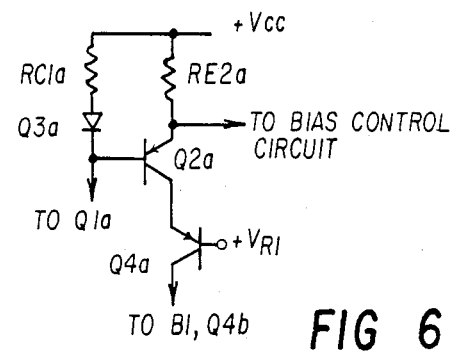
FIG. 6 is a detailed schematic diagram of a portion of the amplifier circuit of FIG. 2 showing the addition of a cascode gain stage that is employed to maintain constant power dissipation in a transistor pair to prevent self-induced temperature changes.

Referring now to FIG. 6, there is shown another embodiment of a portion of the amplifier of FIG. 2 that results in reducing settling time errors that are thermally induced at Q2. This embodiment involves the retention of RC1 and Q3, and the addition of Q4 as a cascode to Q2. Except during short periods of very fast slewing of the output, the collector currents ($I_c$) of Q2a and Q2b remain very nearly constant due to the effects of the bias control circuit 10 and the high input impedance of the B1 buffer, as may be understood with reference to FIG. 2. Only the change in $V_{ce}$ of Q2 of the amplifier of FIG. 2 gives rise to large variations in self-heating since the power dissipation equals $(V_{ce})(I_c)$. By adding Q4x, $V_{ce}$ of Q2x may also be held constant. External heating will still give rise to $V_{be}$ mismatches of Q2x and Q3x, but if iso-thermal layout rules are followed, this problem can be reduced substantially.

With further reference to the amplifier of FIG. 2, and without regard for the modifications thereto that have been discussed above, it is instructive to consider the case of a large signal, high slew rate input signal $V_1$ or $V_2$. Assuming that the rise time or slew rate of this input is fast enough to cause the amplifier to begin to slew rate limit, the inrush of current through RE1 and RF1 into the emitters of the Q1 transistor pair may represent a large portion of, or even exceed the nominal DC bias current flowing in the Q1 transistor pair. In the case of a positive going $V_1$, Q2a will be turned on hard and Q2b will begin to turn off. Since $I_{eQ2a}$ may continue to increase and since $I_{eQ2b}$ can be no less than zero, the condition that $I_{eQ2a}+I_{eQ2b}$ is constant, as established by the bias control circuit, may be violated and the bias control circuit will attempt to reduce the current in the Q0 transistor pair in order to reduce the average current in the Q2 transistor pair. As the bias control circuit 10 reduces the current in the Q0 and Q1 transistor pairs, the current sources CS1a and CS1b (in the event they have been chosen to replace RC1a and RC1b as described above) will eventually saturate at a low $V_{ce}$. This condition may occur within $\frac{1}{2}\pi f_B$ seconds, where $f_b$ is the bandwidth of the bias control circuit 10. At that point in time, all currents in Q2x will cease to flow and the bias control circuit 10 will again attempt to turn the amplifier back on, succeeding after another $\frac{1}{2}\pi f_B$ seconds. As long as the input conditions $V_1$ or $V_2$ persist, this undesirable oscillation will continue. Several modifications to the amplifier of FIG. 2 can reduce the risk of this happening, the first of which is illustrated in FIG. 7.

The CS1 pair may be clamped with diodes to prevent the Q2 transistor pair from being cut off, and to reduce the impedance seen at the base of the Q2 transistors. This reduces the open-loop gain of the bias control circuit and of the amplifier itself, and further reduces the tendency of the Q2 transistors to cut off. An more desirable embodiment of CS1 is illustrated in FIG. 8. This embodiment uses fewer parts and gives slightly better settling time performance. As the drain current of a field effect transistor F1a decreases, $V_{GS}$ decreases and F1a begins to act like a resistance rather than a current source. This in turn reduces the open-loop gain of the bias control circuit and of the amplifier and prevents the amplifier from turning off. The use of one of these two embodiments illustrated in FIGS. 7 and 8 is essential to permit the amplifier to rapidly recover form an input overload in the event RC1x has been replaced by a current source. Until recovery has occurred, accurate settling is not possible.

Another closely related problem occurs in the case of a fast rise time input signal $V_1$ under small signal conditions. This problem is illustrated, with reference to FIG. 2, by assuming that $V_1$ is a square wave input signal. In that case, as $V_1$ goes positive, $I_{eQ1a}$ will increase, and $I_{eQ1b}$ should ideally decrease by the same amount and at the same rate, and so the quantity $(I_{eQ1a}+I_{eQ1b})$ should remain constant. However, because of the effects of $C_{cb}$ and the non-linear relationship of $I_e$ versus $V_{be}$, the value of that quantity will momentarily increase, causing the total current flowing in the Q2 transistor pair to increase also. This will greatly increase the settling time of the amplifier.

Figure 9:
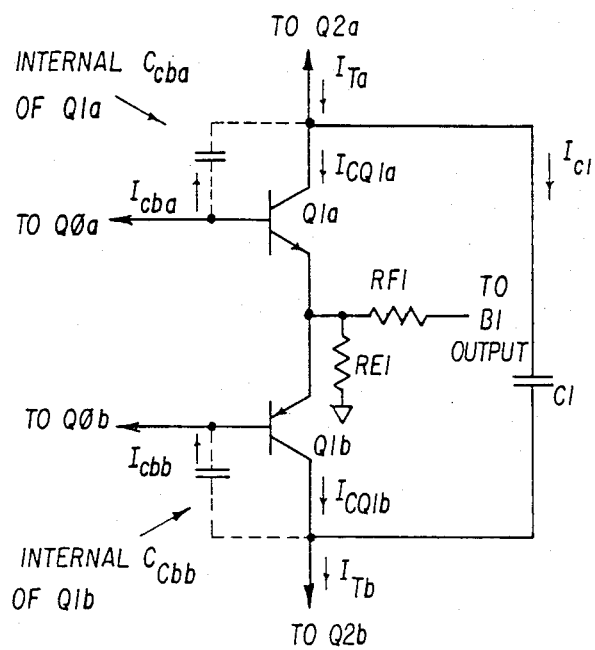
FIG. 9 is a detailed schematic diagram of an inverting input stage of the amplifier of FIG. 2 illustrating the addition of a capacitor that is employed to stabilize the bias current in the amplifier in response to high frequency input signals or those having a fast rise time.

To prevent the occurrence of this problem, a capacitor C1, shown in the embodiment of FIG. 9, is connected between the collectors of Q1a and Q1b. The capacitor C1 acts to maintain a constant voltage across its terminals. The total current, expressed as $(I_{Ta}+I_{Tb})$ $=(I_{cQ1a}+I_{c1}-I_{cba})+(I_{cQ1b}+I_{ca}-I_{cbb})$, will more nearly remain constant as is required for optimum performance. $I_{C1}$ will normally consist of the difference between $I_{cba}$ and $I_{cbb}$. Even though capacitor C1 is primarily useful under small signal, fast rise time conditions, it also helps under large signal conditions.

Figure 10:
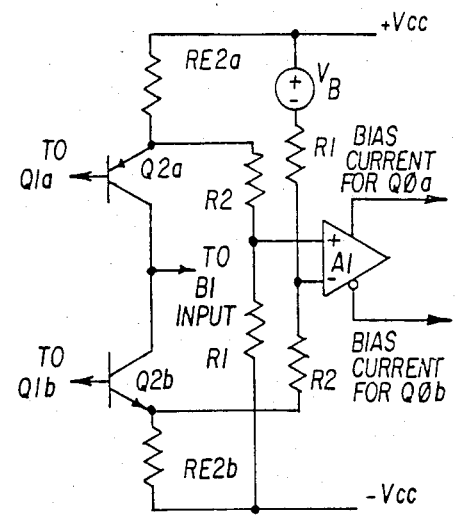
FIG. 10 is a detailed schematic diagram of a modification to the bias control circuit of the prior art that eliminates sensitivity of the bias to supply voltages.

In the Nelson patent referenced above, a bias control circuit is described in which the reference voltages $\pm V_{cc}$ set the current level expressed as $(I_{c2a}+I_{c2b})$. As $\pm V_{cc}$ changes, so does the expressed current level. In order to insure that this current level is independent of $V_{cc}$, the circuit illustrated in FIG. 5 of Nelson may be modified as shown in FIG. 10 of the instant application. In the circuit of FIG. 10, resistors R1 and R2 are equal in value, and $V_B$ is set equal to the quantity (RE2a+RE2b) times (desired current level in Q2 transistor pair).

Figure 11:
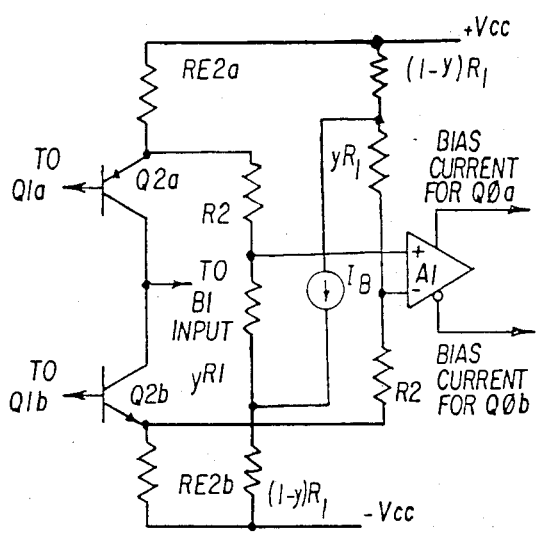
FIG. 11 is a detailed schematic diagram of an alternative modification to the bias control circuit of the prior art that eliminates sensitivity of the bias to supply voltages.

An alternative embodiment of the circuit modification of FIG. 10 is shown in FIG. 11, wherein a current source reference, $I_B$, replaces the voltage source, $V_B$. In this alternative embodiment, the values of resistors R1 and R2 are equal, and $I_B(1-y)R_1$ should equal (RE2x) times (desired current level in Q2 transistor pair).

The bias control circuit described in the Nelson patent, as well as the circuit modifications thereto that have just been described, all compare the average current $(I_{eQ2a}+I_{eQ2bL})$ to the reference current or voltage. Under the large signal conditions described above in connection with FIGs. 7 and 8, these three types of bias control circuit can operate to degrade the signal settling time by turning the amplifier off. Normally, under small signal conditions, $(I_{eQ2a}+I_{eQ2b})=I_T$, a constant. In the presence of a large amplitude, positive going input $V_1$, $I_{eQ2a}$ can increase by a factor of 3 or 4, and $I_{eQ2b}$ will approach zero. As $V_1$ goes negative, $I_{eQ2a}$ becomes small and $I_{eQ2b}$ becomes large. Thus, the arithmetic average of the quantity $(I_{eQ2a}+I_{eQ2b})$ over one complete input cycle can be several times the reference value $I_T$, eventually causing the bias control circuit to shut the amplifier off, and then causing it to oscillate as described above.

Figure 12:
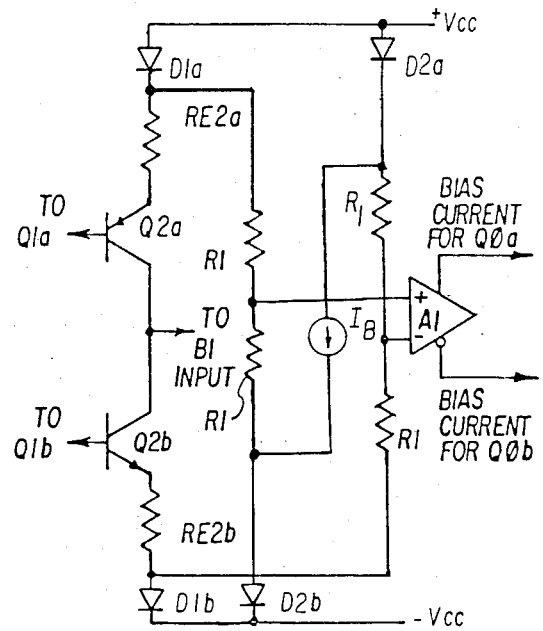
FIG. 12 is a detailed schematic diagram illustrating a modification to the circuit of FIG. 11 that establishes a reference voltage for the bias control circuit that is independent of the supply voltage and that serves to prevent the bias control circuit from turning the amplifier off under large input signal conditions by comparing the geometric average of the sense current to the reference.

A modified bias control circuit, illustrated in FIG. 12, significantly reduces the severity of this problem and allows the amplifier to operate normally at much higher frequencies in the presence of large signal conditions. In that circuit, $(I_{eQ2a}+I_{eQ2b})=2nI_b$, where n is the ratio of the emitter area of D1x to the emitter area of D2x. Also, in that circuit, the voltages across the D1 and D2 diode pairs are compared by the amplifier A1, just as in the case of the three previously described bias control circuits. In this embodiment, however, the relationship between the voltage across the D1 diode pair and the current through it is a logarithmic one. This means that the bias control circuit will attempt to maintain the geometric average of the quantity $(I_{eQ2a}+I_{eQ2b})$ over many cycles equal to the reference current, rather than the arithmetic average, as is the case in the previously described circuits. Thus, for example, if the reference value is 10 mA, $I_{eQ2a}$ could momentarily be 100 mA, $I_{eQ2b}$ could be 1 mA, and the bias control circuit would not begin to turn the amplifier off. However, under small signal conditions in which the instantaneous variations from nominal of $I_{eQ2a}$ and $I_{eQ2b}$ are small, the geometric average and the arithmetic average are nearly equal. Therefore, this circuit provides more optimum conditions for large signal operation, as well as providing nearly identical conditions under small signal operation.

Figure 13:
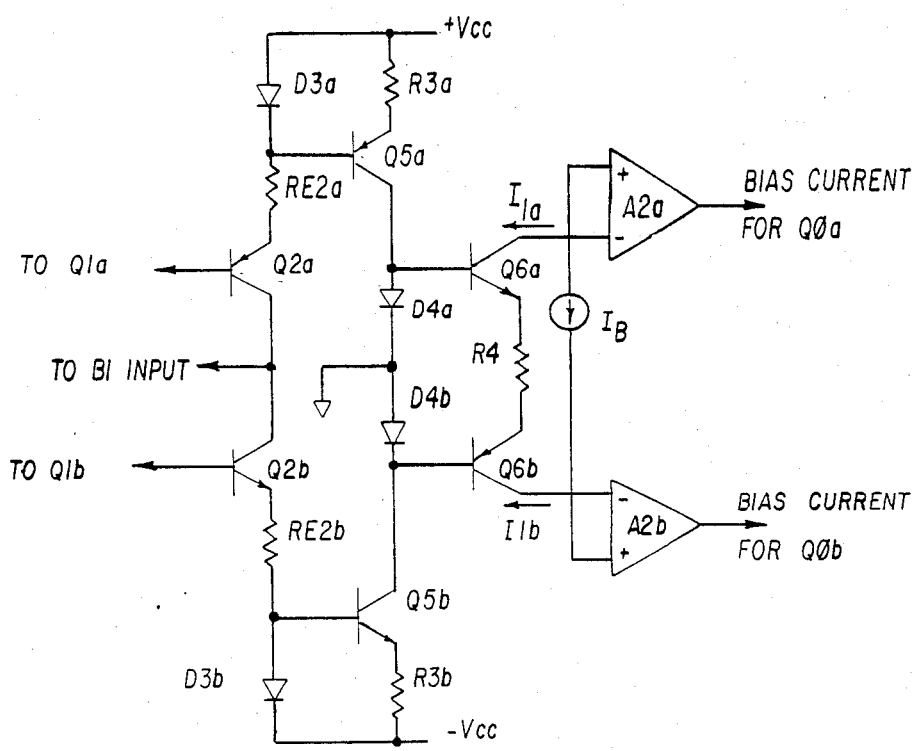
FIG. 13 is a detailed schematic diagram illustrating an alternative modification to the circuit of FIG. 11 that establishes a reference voltage for the bias control circuit that is independent of the supply voltage and that does not require the use of large precision resistors.

One of the requirements for successful operation of an amplifier employing the bias control circuit described in the Nelson patent or any of the three modifications thereof described above in connection with FIGS. 10–12 is that the resistors R1 and R2 be ratio matched precisely to within about 0.2% or better. These resistors should, in practice, be large so that little power dissipation heating is created. However, these requirements are difficult to satisfy using most monolithic integrated circuit processes. In order to avoid the use of resistors R1 and R2, a common mode to differential mode conversion circuit may be employed as illustrated in the detailed schematic diagram of FIG. 13. In that circuit D3x, R3x, and Q5x operate to sense the Q2 pair current and send an attenuated image of the sensed current toward the common to differential mode stage comprising the D4 and Q6 pairs. Q5x is one implementation of a high input impedance voltage-to-current converter. Using a high impedance device to sense the current flowing in D3x insures that all of this current will flow into Q2x, thus reducing the sensitivity of $I_{cQ2x}$ to variations in $\pm V_{cc}$. The collector currents from the Q5 transistor pair are in phase. At the Q6 output, $I_{1a}$ and $I_{1b}$ are of equal magnitude and 180 degrees out of phase. The A2 current amplifier then compares these currents to the reference $I_B$, and servos the current in the Q0 transistor pair until the quantity $(I_{eQ2a}+I_{eQ2b})$ is at the desired level. In this circuit, resistors R3a and R3b are small in value and the needed degree of ratio matching and absolute tolerance can easily be achieved with standard integrated circuit processes. Likewise, resistor R4 is not critical. This circuit also provides high attenuation of the signal from D3 through Q6 and high reverse isolation to prevent input/output interactions in the main amplifier consisting of stages Q0 through Q2. The A2 stage then provides a forward gain which is large enough to overcome the initial attenuation and still provide sufficient forward open-loop gain to insure proper closed-loop operation of the bias control circuit.

Figure 14:
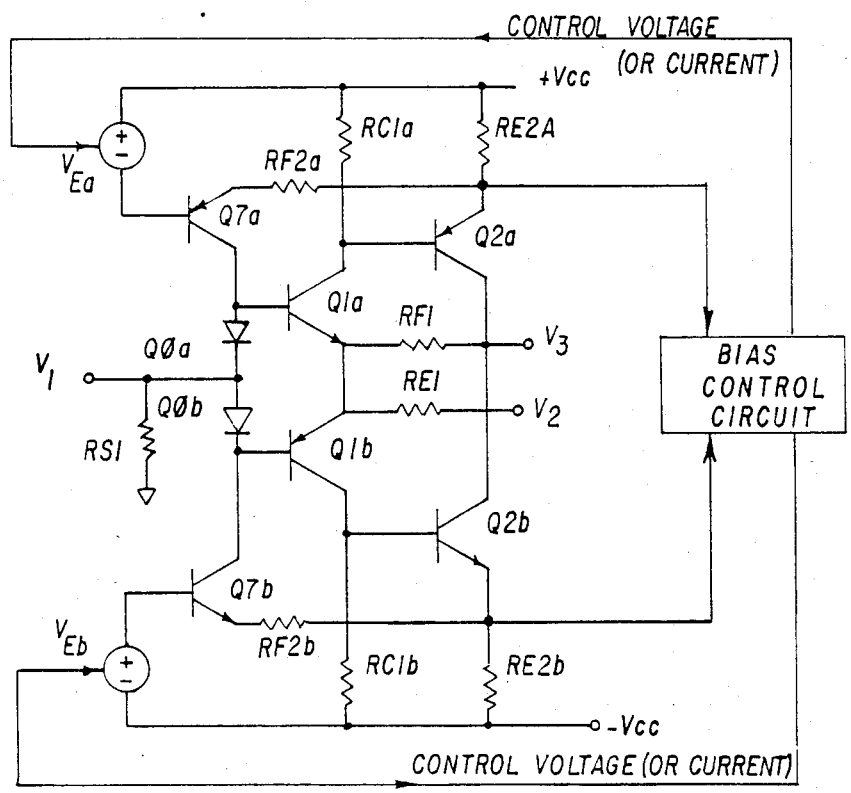
FIG. 14 is a detailed schematic diagram of an amplifier exhibiting an improved power supply rejection ratio, significantly reduced temperature sensitivity of settling time to various transistor pairs, and wider ranges of input impedance, output impedance, and gain with less interaction therebetween.

One major cause of settling time degradation in the amplifier circuit of FIG. 1 is associated with components RF2 and Q1. In some cases RF2 may be infinitely large and the problem is not manifest. However, for finite values of RF2, changes in $V_{beQ0}$ and $V_{beQ2}$ versus temperature or minor perturbations in $\pm V_{cc}$ can cause large settling errors. To prevent this from occurring, the amplifier circuit may be modified in accordance with FIG. 14. Although the equations set forth in the Nelson patent are changed by this modification, the same values of impedance and gain can be achieved. The action of $V_{Ex}$, a voltage source whose value is controlled by the bias control circuit, and Q7x is to supply the signal current flowing through RF2x from a high impedance (the collector of Q7x) into the base of Q1x. The addition of RS1 allows the input impedance to be corrected to the desired value. For optimum performance, the $v_E$ pair may be servo controlled (closed-loop feedback) to minimize DC offset and drift versus temperature at the input.

We claim:

1. A wide-band, variable gain, differential input, DC-coupled amplifier employing current feedback to enhance the settling time characteristic of the amplifier, the amplifier comprising:
    a first pair of transistors each having emitter, base, and collector electrodes, said first pair of transistors being connected to receive a first input signal;
    a second pair of transistors connected to said first pair of transistors, each of said second pair of transistors having emitter, base, and collector electrodes, and being further connected in a command emitter configuration;
    inverting gain means having a high input impedance, a high output impedance, and an inverting voltage gain, said inverting gain means having a pair of inputs connected to the collector electrodes of said second pair of transistors;
    unity gain means having a high input impedance and a low output impedance, said unity gain means having an input connected to an output of said inverting gain means;
    first resistor means connected between an output of said unity gain means and the common emitter electrodes of said second pair of transistors to provide a feedback path therebetween; and
    second resistor means connected between the common emitter electrodes of said second pair of transistors and a second input signal.

2. A wide-band, variable gain, differential input, DC-coupled amplifier employing current feedback to enhance the settling time characteristic of the amplifier, the amplifier comprising:
    a first pair of transistors each having emitter, base, and collector electrodes, the base electrodes thereof being connected in common to receive a first input signal, the collector electrode of a first one of said first pair of transistors being connected to a source of negative supply voltage, and the collector electrode of a second one of said first pair of transistors being connected to a source of positive supply voltage;
    a second pair of transistors each having emitter, base, and collector electrodes, the emitter electrodes thereof being connected in common, the base electrode of a first one of said second pair of transistors being connected to the emitter electrode of said first one of said first pair of transistors, and the base electrode of a second one of said second pair of transistors being connected to the emitter electrode of said second one of said first pair of transistors;
    a first resistor and a first diode connected in series, a cathode electrode of said first diode connected to the collector electrode of said first one of said second pair of transistors, and said first resistor being further connected to said source of positive supply voltage;
    a second resistor and a second diode connected in series, an anode electrode of said second diode being connected to the collector electrode of said second one of said second pair of transistors, and said second resistor being further connected to said source of negative supply voltage;
    a third pair of transistors each having emitter, base, and collector electrodes, the collector electrodes thereof being connected in common, the base electrode of a first one of said third pair of transistors being connected to the collector electrode of said first one of said second pair of transistors, and the base electrode of a second one of said third pair of transistors being connected to the collector electrode of said second one of said second pair of transistors;
    a third resistor connected between the emitter electrode of said first one of said third pair of transistors and said source of positive supply voltage;
    a fourth resistor connected between the emitter electrode of said second one of said third pair of transistors and said source of negative supply voltage;
    unity gain means having a high input impedance and a low output impedance, said unity gain means having an input connected to the common collector electrodes of said third pair of transistors;

a fifth resistor connected between an output of said unity gain means and the common emitter electrodes of said second pair of transistors to provide a feedback path therebetween;

a sixth resistor connected between the common emitter electrodes of said second pair of transistors and a second input signal;

a seventh resistor connected between the emitter electrode of said first one of said first pair of transistors and the emitter electrode of said first one of said third pair of transistors; and an eighth resistor connected between the emitter electrode of said second one of said first pair of transistors and the emitter electrode of said second one of said third pair of transistors.

3. A wide-band, variable gain, differential input, DC-coupled amplifer as in claim 2 further comprising bias control circuit means having a first input connected to the emitter electrode of said first one of said third pair of transistors, a second input connected to the emitter electrode of said second one of said third pair of transistors, a first output connected to the emitter electrode of said first one of said first pair of transistors, and a second output connected to the emitter electrode of said second one of said first pair of transistors.

4. A wide-band, variable gain, differential input, DC-coupled amplifier as in claim 2 further comprising an equalizing capacitor connected between the collector electrode of said first one of said second pair of transistors and the collector electrode of said second one of said second pair of transistors.

5. A wide-band, variable gain, differential input, DC-coupled amplifier employing current feedback to enhance the settling time characteristic of the amplifier, the amplifier comprising:

a first pair of transistors each having emitter, base, and collector electrodes, the base electrodes thereof being connected in common to receive a first input signal, the collector electrode of a first one of said first pair of transistors being connected to a source of negative supply voltage, and the collector electrode of a second one of said first pair of transistors being connected to a source of positive supply voltage;

a second pair of transistors each having emitter, base, and collector electrodes, the emitter electrodes thereof being connected in common, the base electrode of a first one of said second pair of transistors being connected to the emitter electrode of said first one of said first one of said first pair of transistors, and the base electrode of a second one of said second pair of transistors being connected to the emitter electrode of said second one of said first pair of transistors;

a first resistor and a first diode connected in series, a cathode electrode of said first diode being connected to the collector electrode of said first one of said second pair of transistors, and said first resistor being further connected to said source of positive supply voltage;

a second resistor and a second diode connected in series, an anode electrode of said second diode being connected to the collector electrode of said second one of said second pair of transistors, and said second resistor being further connected to said source of negative supply voltage;

a third pair of transistors each having emitter, base, and collector electrodes, the collector electrodes thereof being connected in common, the base electrode of a first one of said third pair of transistors being connected to the collector electrode of said first one of said second pair of transistors, and the base electrode of a second one of said third pair of transistors being connected to the collector electrode of said second one of said second pair of transistors;

a third resistor connected between the emitter electrode of said first one of said third pair of transistors and said source of positive supply voltage;

a fourth resistor connected between the emitter electrode of said second one of said third pair of transistors and said source of negative supply voltage;

unity gain means having a high input impedance and a low output impedance, said unity gain means having an input connected to the common collector electrodes of said third pair of transistors;

a fifth resistor connected between an output of said unity gain means and the common emitter electrodes of said second pair of transistors to provide a feedback path therebetween;

a sixth resistor connected between the common emitter electrodes of said second pair of transistors and a second input signal;

seventh and eighth resistors connected in series between the emitter electrode of said first one of said third pair of transistors and said source of negative supply voltage;

ninth and tenth resistors connected in series with a D.C. voltage source between the emitter electrode of said second one of said third pair of transistors and said source of positive supply voltage; and bidirectional transconductor amplifier means having a non-inverting input connected to the juncture of said seventh and eighth resistors, and having an inverting input connected to the juncture of said ninth and tenth resistors, said bidirectional transconductance amplifier means having a pair of outputs, each supplying a current that is equal in magnitude and opposite in direction to that supplied by the other, one of said pair of outputs being connected to the emitter electrode of one of said first pair of transistors and the other one of said pair of outputs being connected to the emitter electrode of the other one of said first pair of transistors.

6. A wide-band, variable gain, differential input, DC-coupled amplifier as in claim 5 wherein:

said seventh, eighth, ninth, and tenth resistors are equal in value; and said D.C. voltage source is equal to the sum of the resistances of said third and fourth resistors multiplied by a predetermined desired current flow through said third pair of transistors.

7. A wide-band, variable gain, differential input, DC-coupled amplifier as in claim 5 further comprising an equalizing capacitor connected between the collector electrode of said first one of said second pair of transistors and the collector electrode of said second one of said second pair of transistors.

8. A wide-band, variable gain, differential input, DC-coupled amplifier employing current feedback to enhance the settling time characteristic of the amplifier, the amplifier comprising:

a first pair of transistors each having emitter, base, and collector electrodes, the base electrodes thereof being connected in common to receive a first input signal, the collector electrode of a first one of said first pair of transistors being connected to a source of negative supply voltage, and the collector electrode of a second one of said first pair of transistors being connected to a source of positive supply voltage;

a second pair of transistors each having emitter, base, and collector electrodes, the emitter electrodes thereof being connected in common, the base electrode of a first one of said second pair of transistors being connected to the emitter electrode of said first one of said first pair of transistors, and the base electrode of a second one of said second pair of transistors being connected to the emitter electrode of said second one of said first pair of transistors;

a first resistor and a first diode connected in series, a cathode electrode of said first diode being connected to the collector electrode of said first one of said second pair of transistors, and said first resistor being further connected to said source of positive supply voltage;

a second resistor and a second diode connected in series, an anode electrode of said second diode being connected to the collector electrode of said second one of said second pair of transistors, and said second resistor being further connected to said source of negative supply voltage;

a third pair of transistors each having emitter, base, and collector electrodes, the collector electrodes thereof being connected in common, the base electrode of a first one of said third pair of transistors being connected to the collector electrode of said first one of said second pair of transistors, and the base electrode of a second one of said third pair of transistors being connected to the collector electrode of said second one of said second pair of transistors;

a third resistor connected between the emitter electrode of said first one of said third pair of transistors and said source of positive supply voltage;

a fourth resistor connected between the emitter electrode of said second one of said third pair of transistors and said source of negative supply voltage;

unity gain means having a high input impedance and a low output impedance, said unity gain means having an input connected to the common collector electrodes of said third pair of transistors;

a fifth resistor connected between an output of said unity gain means and the common emitter electrodes of said second pair of transistors to provide a feedback path therebetween;

a sixth resistor connected between the common emitter electrodes of said second pair of transistors and a second input signal;

seventh, eighth, and ninth resistors connected in series, said seventh resistor being further connected to said source of negative supply voltage and said ninth resistor being further connected to the emitter electrode of said first one of said third pair of transistors;

tenth, eleventh, and twelfth resistors connected in series, said tenth resistor being further connected to said source of positive supply voltage and said twelfth resistor being further connected to the emitter electrode of said second one of said third pair of transistors; and bidirectional transconductance amplifier means having a non-inverting input connected to the juncture of said eighth and ninth resistors, and having an inverting input connected to the juncture of said eleventh and twelfth resistors, said bidirectional transconductance amplifier means having a pair of outputs, each supplying a current that is equal in magnitude and opposite in direction to that supplied by the other, one of said pair of outputs being connected to the emitter electrode of one of said first pair of transistors and the other one of said pair of outputs being connected to the emitter electrode of the other one of said first pair of transistors.

9. A wide-band, variable gain, differential input, DC-coupled amplifier as in claim 8 wherein:
said third and fourth resistors are equal in value, said eighth and eleventh resistors are equal in value, said ninth and twelfth resistors are equal in value, and said seventh and tenth resistors are equal in value; and
said D.C. current source is equal to the product of the value of said third resistor and a predetermined desired current flow through said third pair of transistors divided by the value of said seventh resistor.

10. A wide-band, variable gain, differential input, DC-coupled amplifier as in claim 9 wherein:
the value of each of said eighth and eleventh resistors is the product of the value of either of said ninth and twelfth resistors and a fraction between zero and one; and
the value of each of said seventh and tenth resistors is the product of the value of either of said ninth and twelfth resistors and the quantity one minus a fraction between zero and one.

11. A wide-band, variable gain, differential input, DC-coupled amplifier as in claim 8 further comprising an equalizing capacitor connected between the collector electrode of said first one of said second pair of transistors and the collector electrode of said second one of said second pair of transistors.

12. A wide-band, variable gain, differential input, DC-coupled amplifier employing current feedback to enhance the settling time characteristic of the amplifier, the amplifier comprising:
a first pair of transistors each having emitter, base, and collector electrodes, the base electrodes thereof being connected in common to receive a first input signal, the collector electrode of a first one of said first pair of transistors being connected to a source of negative supply voltage, and the collector electrode of a second one of said first pair of transistors being connected to a source of positive supply voltage;

a second pair of transistors each having emitter, base, and collector electrodes, the emitter electrodes thereof being connected in common, the base electrode of a first one of said second pair of transistors being connected to the emitter electrode of said first one of said first pair of transistors, and the base electrode of a second one of said second pair of transistors being connected to the emitter electrode of said second one of said first pair of transistors;

a first resistor and a first diode connected in series, a cathode electrode of said first diode being connected to the collector electrode of said first one of said second pair of transistors, and said first resistor being further connected to said source of positive supply voltage;

a second resistor and a second diode connected in series, an anode electrode of said second diode being connected to the collector electrode of said second one of said second pair of transistors, and said second resistor being further connected to said source of negative supply voltage;

a third pair of transistors each having emitter, base, and collector electrodes, the collector electrodes thereof being connected in common, the base electrodes of a first one of said third pair of transistors being connected to the collector electrode of said first one of said second pair of transistors, and the base electrode of a second one of said third pair of transistors being connected to the collector electrode of said second one of said second pair of transistors;

a third resistor connected in series with a third diode, an anode electrode of said third diode being connected to a source of positive supply voltage, and said third resistor being further connected to the emitter electrode of a first one of said third pair of transistors;

a fourth resistor connected in series with a fourth diode, a cathode electrode of said fourth diode being connected to a source of negative supply voltage, and said fourth resistor being further connected to the emitter electrode of a second one of said third pair of transistors;

unity gain means having a high input impedance and a low output impedance, said unity gain means having an input connected to the common collector electrodes of said third pair of transistors;

a fifth resistor connected between an output of said unity gain means and the common emitter electrodes of said second pair of transistors to provide a feedback path therebetween;

a sixth resistor connected between the common emitter electrodes of said second pair of transistors and a second input signal;

seventh and eighth resistors and a fifth diode, all connected in series, a cathode electrode of said fifth diode being connected to said source of negative supply voltage, and said seventh resistor being further connected to the juncture of said third resistor and said third diode;

ninth and tenth resistors and a sixth diode, all connected in series, an anode electrode of said sixth diode being connected to said source of positive supply voltage, and said ninth resistor being further connected to the juncture of said fourth resistor and said fourth diode;

D.C. current source means connected between the juncture of said sixth diode and said tenth resistor and the juncture of said eighth resistor and said fifth diode; and bidirectional transconductance amplifier means having a non-inverting input connected to the juncture of said seventh and eighth resistors, and having an inverting input connected to the juncture of said ninth and tenth resistors, said bidirectional transconductance amplifier means having a pair of outputs, each supplying a current that is equal in magnitude and opposite in direction to that supplied by the other, one of said pair of outputs being connected to the emitter electrode of one of said first pair of transistors and the other one of said pair of outputs being connected to the emitter electrode of the other one of said first pair of transistors.

13. A wide-band, variable gain, differential input, DC-coupled amplifier as in claim 12 wherein:

a junction area of said third diode is equal to a junction area of said fourth diode, and a junction area of said fifth diode is equal to a junction area of said sixth diode; and the junction area of each of said third and fourth diodes is equal to the product of a number greater than zero and the junction area of either of said fifth and sixth diodes.

14. A wide-band, variable gain, differential input, DC-coupled amplifier as in claim 12 further comprising an equalizing capacitor connected between the collector electrode of said first one of said second pair of transistors and the collector electrode of said second one of said second pair of transistors.

15. A wide-band, variable gain, differential input, DC-coupled amplifier employing current feedback to enhance the settling time characteristic of the amplifier, the amplifier comprising:

a first pair of transistors each having emitter, base, and collector electrodes, the base electrodes thereof being connected in common to receive a first input signal, the collector electrode of a first one of said first pair of transistors being connected to a source of negative supply voltage, and the collector electrode of a second one of said first pair of transistors being connected to a source of positive supply voltage;

a second pair of transistors each having emitter, base, and collector electrodes, the emitter electrodes thereof being connected in common, the base electrode of a first one of said second pair of transistors being connected to the emitter electrode of said first one of said first pair of transistors, and the base electrode of a second one of said second pair of transistors being connected to the emitter electrode of said second one of said first pair of transistors;

a first resistor and a first diode connected in series, a cathode electrode of said first diode being connected to the collector electrode of said first one of said second pair of transistors, and said first resistor being further connected to said source of positive supply voltage;

a second resistor and a second diode connected in series, an anode electrode of said second diode being connected to the collector electrode of said second one of said second pair of transistors, and said second resistor being further connected to said source of negative supply voltage;

a third pair of transistors each having emitter, base, and collector electrodes, the collector electrodes thereof being connected in common, the base electrode of a first one of said third pair of transistors being connected to the collector electrode of said first one of said second pair of transistors, and the base electrode of a second one of said third pair of transistors being connected to the collector electrode of said second one of said second pair of transistors;

a third resistor connected in series with a third diode, an anode electrode of said third diode being connected to a source of positive supply voltage, and said third resistor being further connected to the emitter electrode of a first one of said third pair of transistors;

a fourth resistor connected in series with a fourth diode, a cathode electrode of said fourth diode being connected to a source of negative supply voltage, and said fourth resistor being further connected to the emitter electrode of a second one of said third pair of transistors;

unity gain means having a high input impedance and a low output impedance, said unity gain means having an input connected to the common collector electrodes of said third pair of transistors;

a fifth resistor connected between an output of said unity gain means and the common emitter electrodes of said second pair of transistors to provide a feedback path therebetween;

a sixth resistor connected between the common emitter electrodes of said second pair of transistors and a second input signal;

a fourth pair of transistors, each having emitter, base, and collector electrodes, the base electrode of a first one of said fourth pair of transistors being connected to the juncture of said third resistor and said third diode, and the base electrode of a second one of said fourth pair of transistors being connected to the juncture of said fourth resistor and said fourth diode;

a seventh resistor connected between the emitter electrode of said first one of said fourth pair of transistors and a source of positive supply voltage;

an eighth resistor connected between the emitter electrode of said second one of said fourth pair of transistors and a source of negative supply voltage;

fifth and sixth diodes connected in series, the juncture therebetween being connected to a source of ground potential, an anode electrode of said fifth diode being connected to the collector electrode of said first one of said fourth pair of transistors, and a cathode electrode of said sixth diode being connected to the collector electrode of said second one of said fourth pair of transistors;

a fifth pair of transistors, each having emitter, base, and collector electrodes, the base electrode of a first one of said fifth pair of transistors being connected to the collector electrode of said first one of said fourth pair of transistors, and the base electrode of a second one of said fifth pair of transistors being connected to the collector electrode of said second one of said fourth pair of transistors;

a ninth resistor connected between the emitter electrodes of said fifth pair of transistors;

first bidirectional transconductance amplifier means having a non-inverting input and an inverting input, said inverting input being connected to the collector electrode of said first one of said fifth pair of transistors, said first bidirectional transconductance amplifier means having a single current output connected to the emitter electrode of one of said first pair of transistors;

second bidirectional transconductance amplifier means having a non-inverting input and an inverting input, said inverting input being connected to the collector electrode of said second one of said fifth pair of transistors, said second bidirectional transconductance amplifier means having a single current output connected to the emitter electrode of the other one of said first pair of transistors; and D.C. current source means connected between the non-inverting inputs of said first and second bidirectional transconductance amplifier means.

16. A wide-band, variable gain, differential input, DC-coupled amplifier as in claim 15 wherein said seventh and eighth resistors are equal in resistance value.

17. A wide-band, variable gain, differential input, DC-coupled amplifier as in claim 16 wherein said seventh and eighth resistors have a resistance value equal to zero.

18. A wide-band, variable gain, differential input, DC-coupled amplifier as in claim 15 further comprising an equalizing capacitor connected between the collector electrode of said first one of said second pair of transistors and the collector electrode of said second one of said second pair of transistors.

19. A wide-band, variable gain, differential input, DC-coupled amplifier employing current feedback to enhance the settling time characteristic of the amplifier, the amplifier comprising:

a first pair of transistors each having emitter, base, and collector electrodes;

a second pair of transistors each having emitter, base, and collector electrodes, the emitter electrodes thereof being connected in common, the base electrode of a first one of said second pair of transistors being connected to the collector electrode of a first one of said first pair of transistors, and the base electrode of a second one of said second pair of transistors being connected to the collector electrode of a second one of said first pair of transistors;

first and second resistors, said first resistor being connected between the collector electrode of said first one of said second pair of transistors and a source of positive supply voltage, and said second resistor being connected between the collector electrode of said second one of said second pair of transistors and a source of negative supply voltage;

a third pair of transistors each having emitter, base, and collector electrodes, the collector electrodes thereof being connected in common, the base electrode of a first one of said third pair of transistors being connected to the collector electrode of said first one of said second pair of transistors, and the base electrode of a second one of said third pair of transistors being connected to the collector electrode of said second one of said second pair of transistors;

third and fourth resistors, said third resistor being connected between the emitter electrode of said first one of said third pair of transistors and said source of positive supply voltage, and said fourth resistor being connected between the emitter electrode of said second one of said third pair of transistors and said source of negative supply voltage;

a fifth resistor connected between the common emitter electrodes of said second pair of transistors and the common collector electrodes of said third pair of transistors;

a sixth resistor connected to the common emitter electrodes of said second pair of transistors and being further connected to receive a second input signal;

a seventh resistor connected between the emitter electrode of said first one of said first pair of transistors and the emitter electrode of said first one of said third pair of transistors;

an eighth resistor connected between the emitter electrode of said second one of said first pair of transistors and the emitter electrode of said second one of said third pair of transistors;

first and second diodes connected in series, an anode electrode of said first diode being connected to the base electrode of said first one of said second pair of transistors, a cathode electrode of said second diode being connected to the base electrode of said second one of said second pair of transistors, and the juncture between said first and second diodes being connected to receive a first input signal;

first voltage reference means connected between the base electrode of said first one of said first pair of transistors and said source of positive supply voltage; and second voltage reference means connected between the base electrode of said second one of said second pair of transistors and said source of negative supply voltage.

20. A wide-band, variable gain, differential input, DC-coupled amplifier as in claim 19 further comprising bias control circuit means having a first input connected to the emitter electrode of said first one of said third pair of transistors, a second input connected to the emitter electrode of said second one of said third pair of transistors, a first output connected to the emitter electrode of said first one of said first pair of transistors, and a second output connected to the emitter electrode of said second one of said first pair of transistors.

21. A wide-band, bariable gain, differential input, DC-coupled amplifier as in claim 19 further comprising an equalizing capacitor connected between the collector electrode of said first one of said second pair of transistors and the collector electrode of said second one of said second pair of transistors.

22. A wide-band, variable gain, differential input, DC-coupled amplifier employing current feedback to enhance the settling time characteristic of the amplifier, the amplifier comprising:

a first pair of transistors each having emitter, base, and collector electrodes, the base electrodes of said first pair of transistors being connected in common to receive a first input signal, the collector electrode of a first one of said first pair of transistors being connected to a source of negative supply voltage, and the collector electrode of a second one of said first pair of transistors being connected to a source of positive supply voltage;

a second pair of transistors each having emitter, base, and collector electrodes, the emitter electrodes thereof being connected in common, the base electrode of a first one of said second pair of transistors being connected to the emitter electrode of said first one of said first pair of transistors, and the base electrode of a second one of said second pair of transistors being connected to the emitter electrode of said second one of said first pair of transistors;

a first resistor and a first diode connected in series, a cathode electrode of said first diode being connected to the collector electrode of said first one of said second pair of transistors, and said first resistor being further connected to said source of positive supply voltage;

a second resistor and a second diode connected in series, an anode electrode of said second diode being connected to the collector electrode of saod second one of said second pair of transistors, and said second resistor being further connected to said source of negative supply voltage;

a third pair of transistors each having emitter, base, and collector electrodes, the base electrode of a first one of said third pair of transistors being connected to the collector electrode of said first one of said second pair of transistors, and the base electrode of a second one of said third pair of transistors being connected to the collector electrode of said second one of said second pair of transistors;

a fourth pair of transistors each having emitter, base, and collector electrodes, the collector electrodes thereof being connected in common, the emitter electrode of a first one of said fourth pair of transistors being connected to the collector electrode of said first one of said third pair of transistors, the emitter electrode of a second one of said fourth pair of transistors being connected to the collector electrode of said second one of said third pair of transistors, and the base electrode of each one of said fourth pair of transistors being connected to a source of reference voltage;

a third resistor connected between the emitter electrode of said first one of said third pair of transistors and said source of positive supply voltage;

a fourth resistor connected between the emitter electrode of said second one of said third pair of transistors and said source of negative supply voltage;

unity gain means having a high input impedance and a low output impedance, said unity gain means having an input connected to the common collector electrodes of said fourth pair of transistors;

a fifth resistor connected between an output of said unity gain means and the common emitter electrodes of said second pair of transistors to provide a feedback path therebetween;

a sixth resistor connected between the common emitter electrodes of said second pair of transistors and a second input signal;

a seventh resistor connected between the emitter electrode of said first one of said first pair of transistors and the emitter electrode of said first one of said third pair of transistors; and an eighth resistor connected between the emitter electrode of said second one of said first pair of transistors and the emitter electrode of said second one of said third pair of transistors.

23. A wide-band, variable gain, differential input, DC-coupled amplifier as in claim 22 further comprising bias control circuit means having a first input connected to the emitter electrode of said first one of said third pair of transistors, a second input connected to the emitter electrode of said second one of said third pair of transistors, a first output connected to the emitter electrode of said first one of said first pair of transistors, and a second output connected to the emitter electrode of said second one of said first pair of transistors.

24. A wide-band, variable gain, differential input, DC-coupled amplifier as in claim 22 further comprising an equalizing capacitor connected between the collector electrode of said first one of said second pair of transistors and the collector electrode of said second one of said second pair of transistors.

25. A wide-band, variable gain, differential input, DC-coupled amplifier employing current feedback to enhance the settling time characteristic of the amplifier, the amplifier comprising:

a first pair of transistors each having emitter, base, and collector electrodes, the base electrodes of said first pair of transistors being connected in common to receive a first input signal, the collector electrode of a first one of said first pair of transistors being connected to a source of negative supply voltage, and the collector electrode of a second one of said first pair of transistors being connected to a source of positive supply voltage;

a second pair of transistors each having emitter, base, and collector electrodes, the emitter electrodes thereof being connected in common, the base electrode of a first one of said second pair of transistors being connected to the emitter electrode of said first one of said first pair of transistors, and the base electrode of a second one of said second pair of transistors being connected to the emitter electrode of said second one of said first pair of transistors;

first constant value current source means having a first terminal connected to said source of positive supply voltage, said first constant value current source means also having a second terminal and a third terminal;

second constant value current source means having a first terminal connected to said source of negative supply voltage, said second constant value current source means also having a second terminal and a third terminal;

reference bias means connected between the second terminal of said first constant value current source means and the second terminal of said second constant value current source means;

a third pair of transistors each have emitter, base, and collector electrodes, the collector electrodes thereof being connected in common, the base electrode of a first one of said third pair of transistors being connected to the third terminal of said first constant value current source means, and the base electrode of a second one of said third pair of transistors being connected to the third terminal of said second constant value current source means;

a first resistor connected between the emitter electrode of said first one of said third pair of transistors and said source of positive supply voltage;

a second resistor connected between the emitter electrode of said second one of said third pair of transistors and said source of negative supply voltage;

unity gain means having a high input impedance and a low output impedance, said unity gain means having an input connected to the common collector electrodes of said third pair of transistors;

a third resistor connected between the output of said unity gain means and the common emitter electrodes of said second pair of transistors to provide a feedback path therebetween;

a fourth resistor connected between the common emitter electrodes of said second pair of transistors and a second input signal;

a fifth resistor connected between the emitter electrode of said first one of said first pair of transistors and the emitter electrode of said first one of said third pair of transistors; and a sixth resistor connected between the emitter electrode of said second one of said first pair of transistors and the emitter electrode of said second one of said third pair of transistors.

26. A wide-band, variable gain, differential input, DC-coupled amplifier as in claim 25 further comprising:

a first diode having an anode electrode connected to the second terminal of said first constant value current source means and having a cathode electrode connected to a first terminal of said reference bias means;

a second diode having a cathode electrode connected to the second terminal of said second constant value current source means and having an anode electrode connected to a second terminal of said reference bias means;

a third diode having an anode electrode connected to the base electrode of said first one of said third pair of transistors and having a cathode electrode connected to the cathode electrode of said first diode;

a fourth diode having an anode electrode connected to the base electrode of said second one of said third pair of transistors and having a cathode electrode connected to the cathode electrode of said second diode;

a first capacitor connected between the cathode electrodes of said first and third diodes and said source of positive supply voltage; and a second capacitor connected between the cathode electrodes of said second and fourth diodes and said source of negative supply voltage.

27. A wide-band, variable gain, differential input, DC-coupled amplifier as in claim 25 wherein said reference bias means comprises a current source.

28. A wide-band, variable gain, differential input, DC-coupled amplifier as in claim 25 wherein said reference bias means comprises a resistor.

29. A wide-band, variable gain, differential input, DC-coupled amplifier as in claim 25 wherein said first constant value current source means comprises:

a fourth pair of transistors each having emitter, base, and collector electrodes, the base electrodes thereof being connected in common, the collector electrode of a first one of said fourth pair of transistors forming the second terminal of said first constant value current source means and being further connected to the common base electrodes of said fourth pair of transistors, and the collector electrode of a second one of said fourth pair of transistors forming the third terminal of said first constant value current source means;

a seventh resistor connected between the emitter electrode of said first one of said fourth pair of transistors and the first terminal of said first constant value current source means; and an eighth resistor connected between the emitter electrode of said second one of said fourth pair of transistors and the first terminal of said first constant value current source means; and wherein said second constant value current source means comprises:

a fifth pair of transistors each having emitter, base, and collector electrodes, the base electrodes thereof being connected in common, the collector electrode of a first one of said fifth pair of transistors forming the second terminal of said second constant value source means and being further connected to the common base electrodes of said fifth pair of transistors, and the collector electrode of a second one of said fifth pair of transistors forming the third terminal of said second constant value current source means;

a ninth resistor connected between the emitter electrode of said first one of said fifth pair of transistors and the first terminal of said second constant value current source means; and a tenth resistor connected between the emitter electrode of said second one of said fifth pair of transistors and the first terminal of said second constant value current source means.

30. A wide-band, variable gain, differential input, DC-coupled amplifier as in claim 29 wherein the resistance value of each of said seventh, eighth, ninth, and tenth resistors is equal to zero.

31. A wide-band, variable gain, differential input, DC-coupled amplifier as in claim 25 further comprising bias control circuit means having a first input connected to the emitter electrode of said first one of said third pair of transistors, a second input connected to the emitter electrode of said second one of said third pair of transistors, a first output connected to the emitter electrode of said first one of said first pair of transistors, and a second output connected to the emitter electrode of said second one of said first pair of transistors.

32. A wide-band, variable gain, differential input, DC-coupled amplifier as in claim 25 further comprising an equalizing capacitor connected between the collector electrode of said first one of said second pair of transistors and the collector electrode of said second one of said second pair of transistors.

33. A wide-band, variable gain, differential input, DC-coupled amplifier as in claim 25 wherein said first constant value current source means comprises:
a first field effect transistor having source, gate, and drain electrodes, the drain electrode thereof forming the first terminal of said first constant value current source means, and the gate electrode thereof forming the second and third terminals of said first constant value current source means; and
a seventh resistor connected between the source electrode of said first field effect transistor and the second and third terminals of said first constant value current source means; wherein said second constant value current source means comprises:
a second field effect transistor having source, gate, and drain electrodes, the drain electrode thereof forming the first terminal of said second constant value current source means, and the gate electrode thereof forming the second and third terminals of said second constant value current source means; and
an eighth resistor connected between the source electrode of said second field effect transistor and the second and third terminals of said second constant value current source means; and wherein said reference bias means comprises an open circuit.

34. A wide-band, variable gain, differential input, DC-coupled amplifier as in claim 33 wherein the resistance value of each of said seventh and eighth resistors is equal to zero.

35. A wide-band, variable gain, differential input, DC-coupled amplifier as in claim 33 further comprising bias control circuit means having a first input connected to the emitter electrode of said first one of said third pair of transistors, a second input connected to the emitter electrode of said second one of said third pair of transistors, a first output connected to the emitter electrode of said first one of said first pair of transistors, and a second output connected to the emitter electrode of said second one of said first pair of transistors.

36. A wide-band, variable gain, differential input, DC-coupled amplifier as in claim 33 further comprising an equalizing capacitor connected between the collector electrode of said first one of said second pair of transistors and the collector electrode of said second one of said second pair of transistors.

* * * * *